(12) United States Patent
Hirose

(10) Patent No.: US 6,485,602 B2
(45) Date of Patent: Nov. 26, 2002

(54) PLASMA PROCESSING APPARATUS

(75) Inventor: Eiji Hirose, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/906,731

(22) Filed: Jul. 18, 2001

(65) Prior Publication Data

US 2002/0007915 A1 Jan. 24, 2002

(30) Foreign Application Priority Data

Jul. 19, 2000 (JP) ........................................ 2000-219783

(51) Int. Cl.[7] .............................................. H01L 21/00
(52) U.S. Cl. ............................ 156/345.44; 156/345.47; 118/723 E
(58) Field of Search ....................... 156/345.44, 345.43, 156/345.47; 118/723 E; 204/298.08, 298.34

(56) References Cited

U.S. PATENT DOCUMENTS 5,900,103 A * 5/1999 Tomoyasu et al. ....... 118/723 E

FOREIGN PATENT DOCUMENTS

JP 2001-7086 1/2001

* cited by examiner

*Primary Examiner*—Thi Dang
(74) *Attorney, Agent, or Firm*—Oblon, Spivak, McClelland, Maier & Neustadt, P.C.

(57) ABSTRACT

The present invention concerns a plasma processing apparatus for processing a processing object by applying two types of high-frequency power with different frequencies to generate plasma. A first high-frequency line is provided with a first filter circuit for attenuating a high-frequency current from a second high-frequency power supply. A second high-frequency line is provided with a second filter circuit for attenuating a high-frequency current from a first high-frequency power supply. The first filter circuit is provided with a variable capacitor for changing a circuit constant. For changing the circuit constant, the variable capacitor is varied so that a resonance point becomes greater than an optimum resonance point most attenuating a high frequency in the second high-frequency power supply. Doing so decreases a sputter rate of the generated plasma affected on a wall surface of the processing chamber.

7 Claims, 7 Drawing Sheets

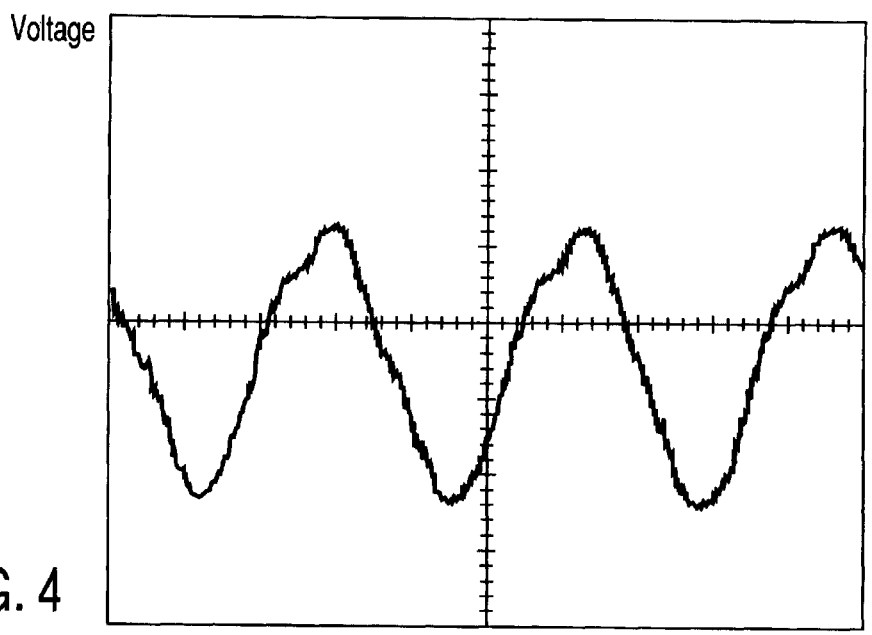
F I G. 4
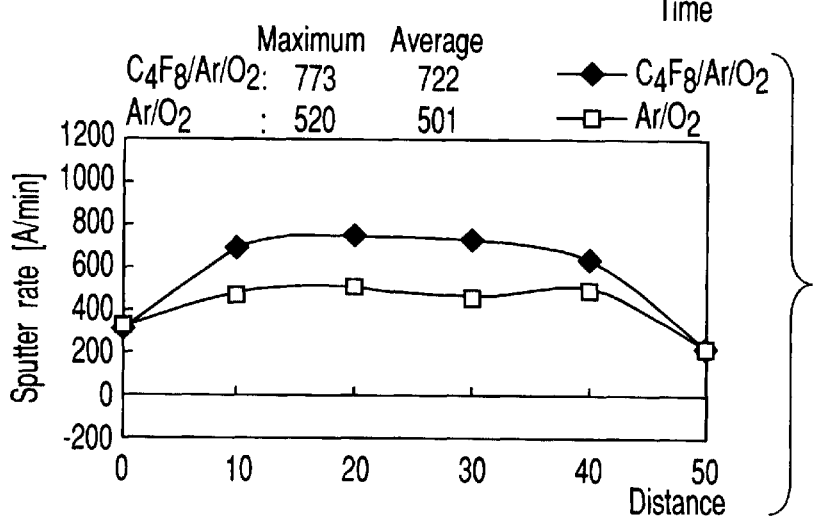
F I G. 5A
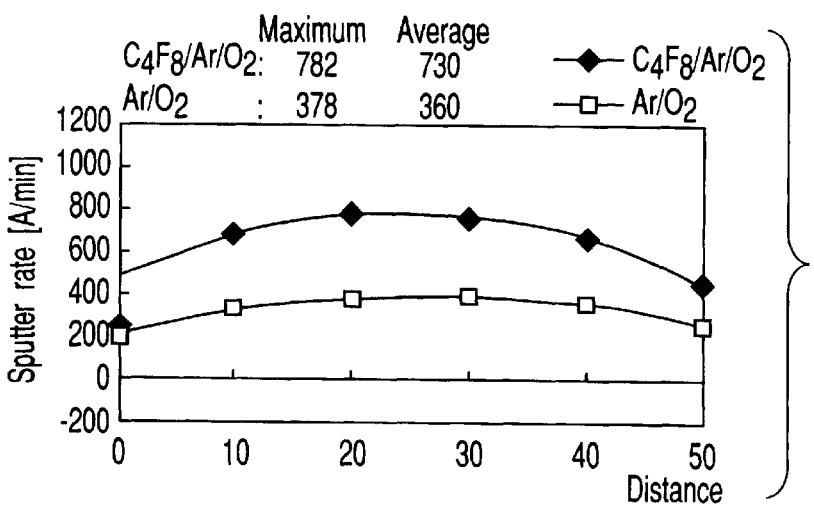
F I G. 5B

PLASMA PROCESSING APPARATUS

CROSS-REFERENCE TO RELATED APPLICATIONS

This application is based upon and claims the benefit of priority from the prior Japanese Patent Application No. 2000-219783, filed Jul. 19, 2000, the entire contents of which are incorporated herein by reference.

BACKGROUND OF THE INVENTION

1. Field of the Invention

The present invention relates to a plasma processing apparatus capable of suppressing a damage due to sputtering to a wall surface of a processing chamber during plasma occurrence.

2. Description of the Related Art

Conventionally, there are two types of plasma processing apparatuses. One type generates plasma by applying high-frequency power with a single type of frequency. The other type generates plasma by applying high-frequency power with two types of frequency. Especially, the latter type of plasma processing apparatus is configured to generate high-density plasma using high-frequency power with a high frequency, and generate a bias potential using high-frequency power with a low frequency. In recent years, there is often used a plasma processing apparatus which alternates the two types of frequencies according to necessity.

As shown in FIG. 10, this plasma processing apparatus comprises upper and lower electrodes 2a and 2b, and first and second high-frequency power supplies 3a and 3b. The upper and lower electrodes 2a and 2b are arranged parallel facing each other in a processing chamber 1. The first and second high-frequency power supplies 3a and 3b supply these upper and lower electrodes 2a and 2b with first and second high-frequency powers having different frequencies.

A matching circuit 5a is provided in the middle of a first power supply line 4a connecting the first high-frequency power 3a and the upper electrode 2a. A matching circuit 5b is provided on a second power supply line 4b connecting the second high-frequency power 3b and the lower electrode 2b.

Further, the first power supply line 4a connects with a first filter circuit 6a as a return circuit. This filter circuit 6a has a fixed circuit constant and attenuates a second high-frequency component. The second power supply line 4b connects with a second filter circuit 6b as a return circuit. This filter circuit 6b has a fixed circuit constant and attenuates a first high-frequency component. In the first and second filter circuits 6a and 6b, each circuit constant is set to a value resonating with a high frequency to be filtered.

When plasma processing is applied to a processing object such as a semiconductor wafer, the processing object is mounted on the lower electrode 2b, for example. The first and second high-frequency power supplies 3a and 3b supply corresponding high-frequency powers to the upper and lower electrodes 2a and 2b, respectively, to generate plasma P therebetween. Further, a bias voltage is applied to the lower electrode 2b to perform specified plasma processing for the semiconductor wafer on the lower electrode 2b.

The plasma processing apparatus attenuates high-frequency power with a different frequency on the first and second power supply lines 4a and 4b. The first and second high-frequency power supplies 3a and 3b supply respective high-frequency powers to the upper and lower electrodes 2a and 2b under an optimum condition.

In this technology, however, a potential difference occurs between the plasma potential and the wall surface of the processing chamber 1. Sputtering due to an ion component in the plasma erodes the wall surface. Simultaneously applying two types of high-frequency power decreases an effective ground area for one electrode compared to the case where a single frequency is applied. A sputter rate increases for the decreased ground area, causing more damages of the wall surface. This has been a cause of the shortening of the processing chamber life (usable period).

The problem of shortening the processing chamber life becomes more serious when the processing object such as a semiconductor wafer has an increased area, throughput is increased, or the high-frequency power is increased to further increase the sputter rate, and the like.

Conventionally, countermeasures have been taken to suppress damages to the wall surface. For example, the processing chamber is enlarged to increase the ground area and decrease the sputter rate. Alternatively, a resin coating is applied to the wall surface to prevent wear to the wall surface. In any case, substantial countermeasures is unavailable, causing a problem of increasing costs for additional processing.

BRIEF SUMMARY OF THE INVENTION

It is an object of the present invention to provide a plasma processing apparatus capable of decreasing a sputter rate damaging a processing chamber wall surface during plasma generation and extending the usable life of the processing chamber.

In order to achieve the above-mentioned objects, a plasma processing apparatus according to the present invention for applying a specified plasma processing to a processing object comprises first and second electrodes arranged in parallel in a processing chamber so that they face to each other; a first high-frequency power supply for applying a first high-frequency power to the first and second electrodes via a first power supply line; a second high-frequency power supply for applying a second high-frequency power to the second electrode via a second power supply line; a first filter circuit for attenuating the second high-frequency power flowing through the first power supply line; and a second filter circuit for attenuating the first high-frequency power flowing through the second power supply line, wherein the first filter circuit includes a variable capacitor for varying a circuit constant in order to increase a resonance point from an optimum resonance point most attenuating the second high-frequency power and for decreasing a sputter rate for a wall surface of the processing chamber during plasma occurrence.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 4 shows a voltage characteristic from the second high-frequency power supply on the power supply line a when a capacitor capacity of the first filter circuit in FIG. 1 is set to 2,000 pF;

FIG. 5A shows the relationship between a sputter rate for the processing chamber wall surface and a capacitor capacity for the filter circuit when the capacitor capacity is 2,500 pF;

FIG. 5B shows the relationship between a sputter rate for the processing chamber wall surface and a capacitor capacity for the filter circuit when the capacitor capacity is 2,200 pF;

DETAILED DESCRIPTION OF THE INVENTION

Embodiments of the present invention will be described in further detail with reference to the accompanying drawings.

The following describes the first embodiment of the present invention with reference to FIGS. 1 to 6.

Figure 1:
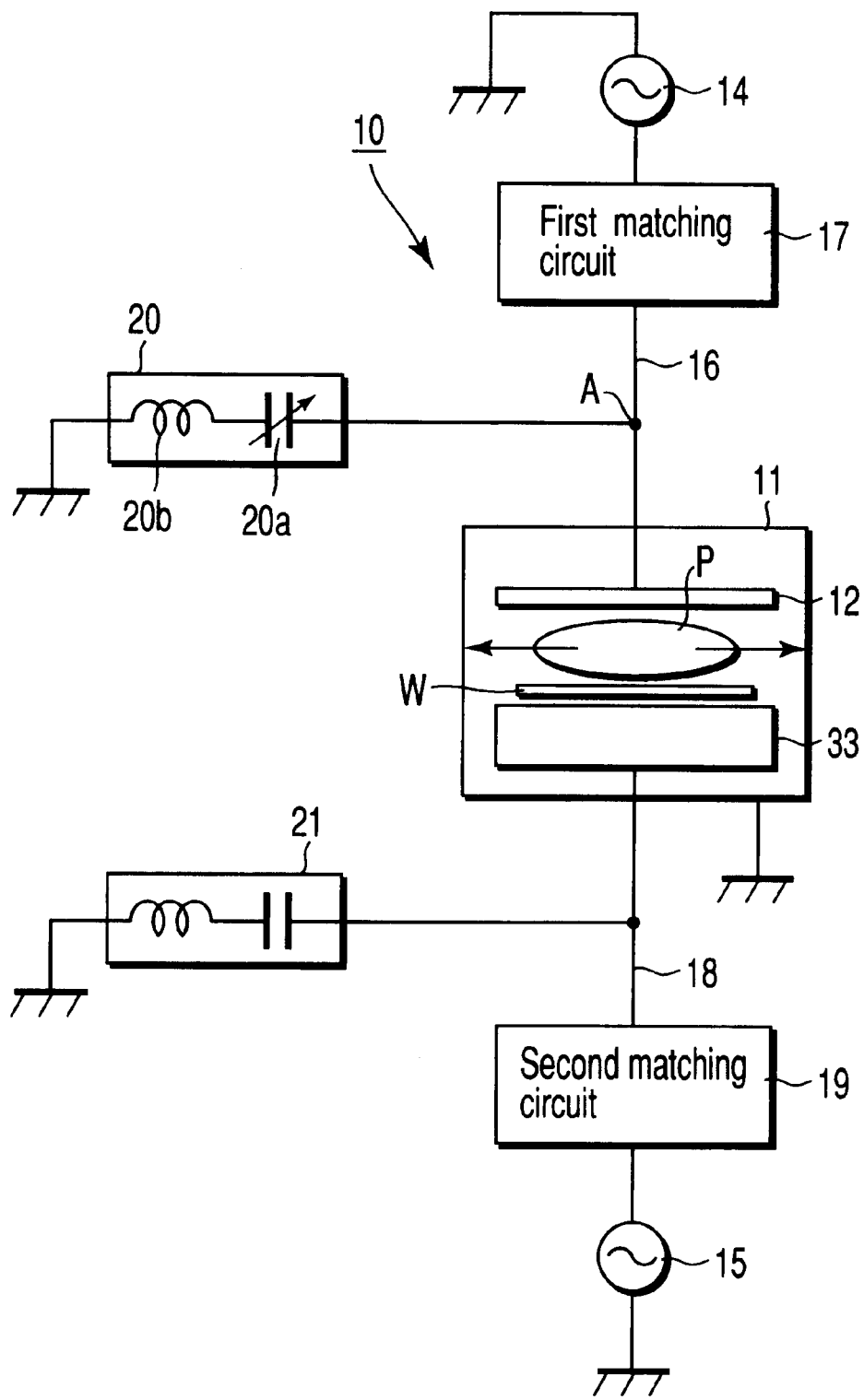
FIG. 1 is a configuration chart showing a first embodiment of a plasma processing apparatus according to the present invention.

FIG. 1 schematically shows a plasma processing apparatus 10 for etching as the first embodiment. This plasma processing apparatus 10 includes a processing chamber (processing area) 11 formed of a conductive material such as aluminum. In this processing chamber 11, an upper electrode 12 and a lower electrode 13 are arranged in parallel with a specified interval so that they face each other. The upper electrode 12 is connected to a first high-frequency power supply 14 via a first power supply line 16 and a first matching circuit 17. The lower electrode 13 is connected to a second high-frequency power supply 15 via a second matching circuit 19. This lower electrode 13 also functions as a chuck top for mounting a processing object such as a semiconductor wafer, for example.

The first high-frequency power supply 14 applies, say, 60-MHz high-frequency power to the upper electrode 12. Plasma P is generated in an atmosphere of process gas supplied between the upper electrode 12 and the lower electrode 13.

The second high-frequency power supply 15 applies 2-MHz high-frequency power to the lower electrode 13 to generate a bias potential corresponding to the plasma potential. An ion component in the plasma is introduced to the surface of a semiconductor wafer W for performing, say, reactive ion etching (RIE).

Since the first matching circuit 17 is provided, it is possible to supply the maximum power to the upper electrode 12 from the first high-frequency power supply 14. Since the second matching circuit 19 is provided, it is possible to supply the maximum power to the lower electrode 13 from the second high-frequency power supply 15.

The first power supply line 16 is provided with a first filter circuit 20. The second power supply line 18 is provided with a second filter circuit 21. The first filter circuit 20 includes an LC series resonant circuit with varying the circuit constant. The LC series resonant circuit selectively filters a high-frequency current output from the second high-frequency power supply 15 for preventing the current from reaching the first high-frequency power supply 14. The second filter circuit 21 includes an LC series resonant circuit with a fixed circuit constant. This LC series resonant circuit prevents a high-frequency current from the first high-frequency power supply 14 from reaching the second high-frequency power supply 15.

The circuit constant for the first filter circuit 20 is changed by using a variable capacitor 20a and changing the capacitance. The sputter rate according to the plasma P is decreased by changing the capacity of the variable capacitor 20a.

In the plasma processing apparatus according to the present invention, the first filter circuit 20 is not limited to the function as a return circuit. Since the circuit constant is variable, the first filter circuit also allows the capacitor capacitance to be varied in accordance with the sputter rate, varying with the plasma potential and decreasing the sputter rate to such a degree that the product throughput is only slightly affected. Since the sputter rate can be decreased, it is possible to suppress damage to the wall surface of the processing chamber 11 and extend the processing chamber life (usable period).

The following describes how to set the circuit constant of the first filter circuit 20. First, the optimum resonance point is to be found.

The first high-frequency power supply 14 (60 MHz) and the second high-frequency power supply 15 (2 MHz) apply high-frequency power to the upper electrode 12 and the lower electrode 13, respectively. The capacitor capacity of the first filter circuit 20 is varied by measuring a voltage waveform, say, at point A on the first power supply line 16.

Figure 2:
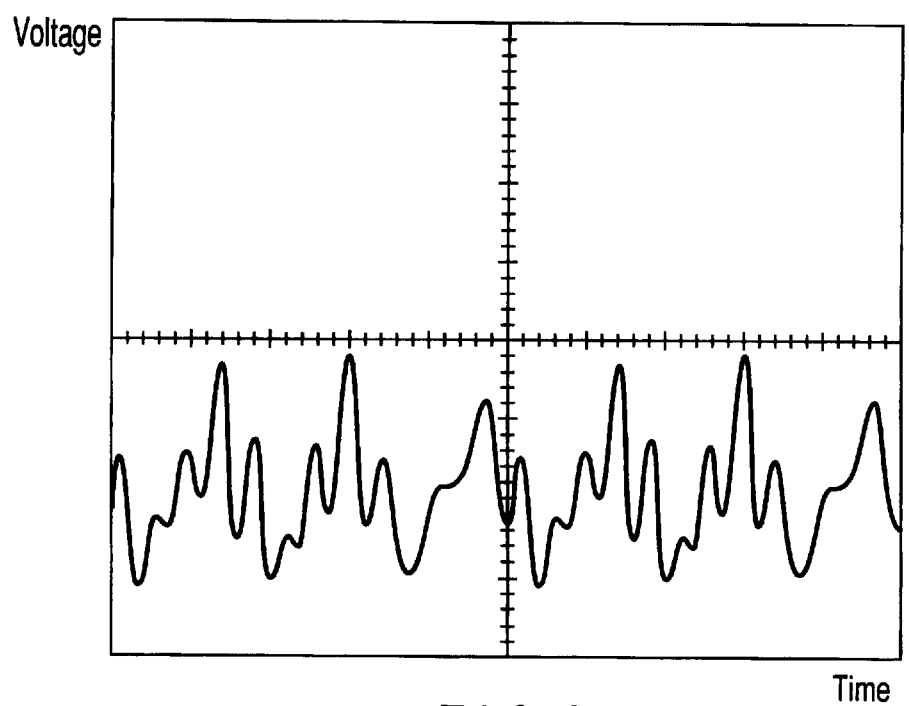
FIG. 2 shows a voltage characteristic from a second high-frequency power supply on a power supply line a when a first filter circuit shown in FIG. 1 is omitted.
Figure 3:
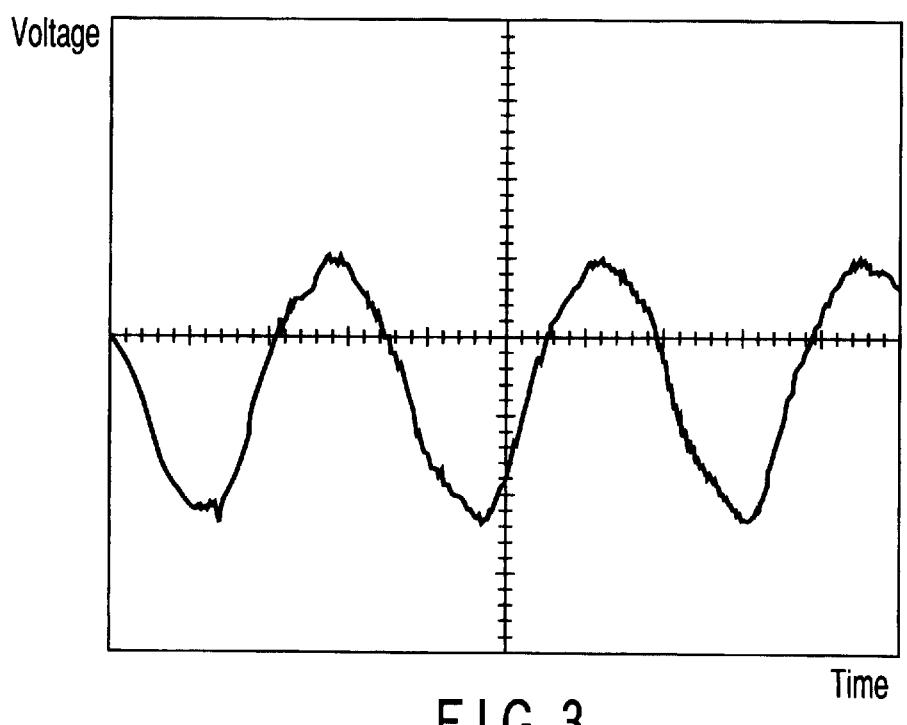
FIG. 3 shows a voltage characteristic from the second high-frequency power supply on the power supply line a when a capacitor capacity of the first filter circuit in FIG. 1 is set to 2,500 pF.
Figure 6:
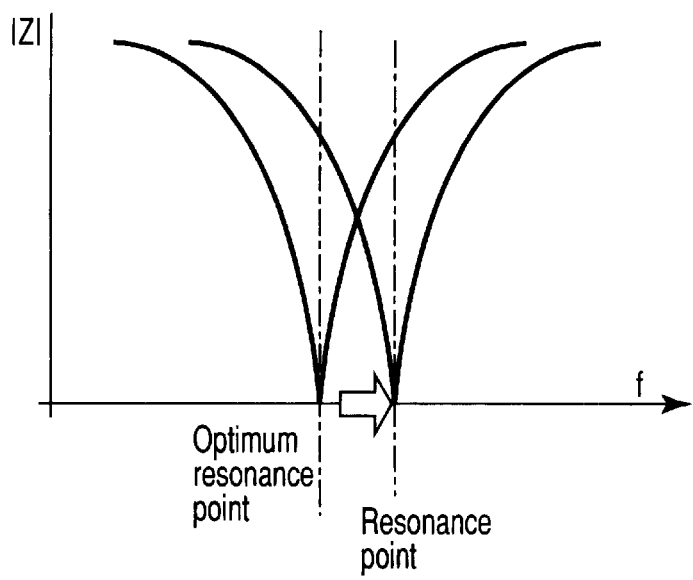
FIG. 6 shows a decrease in the sputter rate.

When a coil 20b of the first filter circuit 20 is set to an inductance of 2.5 μH, for example, the capacitor capacity resonant with the 2-MHz high frequency is up to approximately 2,500 pF. When two frequencies (60 MHz and 2 MHz) are applied, the capacitor capacitance is divided into three types, namely, no filter circuit provided, the capacitor capacity set to 2,500 pF, and the capacitor capacity set to 2,000 pF. The voltage waveform in each case is measured at point A on the first power supply line 16. As measurement results, FIG. 2 shows a voltage characteristic with no filter circuit provided. FIG. 3 shows a voltage characteristic with the capacitor capacity set to 2,500 pF. FIG. 4 shows a voltage characteristic with the capacitor capacity set to 2,000 pF.

As clearly seen in these figures, when the coil inductance L is fixed to 2.5 μH, the capacitor capacity is 2,500 pF, allowing the voltage waveform to most optimally resonate with the sine wave. When the capacitor capacity is set to 2,000 pF, the sine wave is slightly deformed in comparison with that of 2,500 pF.

Accordingly, when the first filter circuit 20 is used only as a return circuit, setting the capacitor capacity to 2,500 pF provides an optimum resonance point. According to this embodiment, however, the first filter circuit 20 is requested to have the function of decreasing the sputter rate in addition to the function as a return circuit.

For this purpose, the above-mentioned optimum resonance point just needs to be shifted so that frequency $f [=\frac{1}{2}\pi \sqrt{(L \cdot C)}]$ becomes large, where C is capacitance and L is inductance (coil).

Specifically, the relationship between the sputter rate and the capacitor capacity is examined. For this purpose, the plasma processing apparatus is operated under the following conditions. Given that the coil inductance is fixed to 2.5 $\mu$H and the capacitor capacity is set to 2,500 pF in the first filter circuit 20, the sputter rate is measured under the following process conditions 1 and 2. The measurement results in the relation shown in FIG. 5A. Likewise, when the capacitor capacity is set to 2,000 pF, measuring the sputter rate results in the relationship shown in FIG. 5B.

1. Process condition for $C_4F_8/Ar/O_2$ gas

Wafer: 300 mm

Film to be etched: Silicon oxide film

Processing: Contact

Power applied to the upper electrode: Frequency=60 MHz, Power=3,300 W

Power applied to the lower electrode: High frequency=2 MHz, Power=3,800 W

Gap between electrodes: 35 mm

Process pressure: 20 mTorr

Process gas: $C_4F_8$=20 sccm

Ar=400 sccm $O_2$=15 sccm

2. Process condition for $Ar/O_2$ gas

Film to be etched: Silicon oxide film

Processing: Contact

Power applied to the upper electrode: Frequency=60 MHz, Power=3,300 W

Power applied to the lower electrode: High frequency=2 MHz, Power=3,800 W

Gap between electrodes: 35 mm

Process pressure: 20 mTorr

Process gas: Ar=400 sccm $O_2$=400 sccm

According to the results in FIGS. 5A and 5B, it is clear that the filter circuit set at 2.5 $\mu$H and 2,000 pF greatly decreases the sputter rate for the $Ar/O_2$ gas compared to the filter circuit set at 2.5 $\mu$H and 2,500 pF. Further, it is clear that the $C_4F_8/Ar/O_2$ gas causes little change in the sputter rate for both filter circuits. Basically, the $C_4F_8/Ar/O_2$ gas is a chemical sputter involving a chemical reaction. The $Ar/O_2$ gas is physical sputter. This means that the plasma potential varies with the circuit constants.

Accordingly, it is found that the filter circuit with 2.5 $\mu$H and 2,000 pF is superior to the optimally resonant filter circuit with 2.5 $\mu$H and 2,500 pF, which decreases the sputter rate. Actually, however, the former is slightly inferior to the latter with respect to the resonance phenomenon.

According to this embodiment as mentioned above, the first high-frequency line 16 is provided with the first filter circuit 20 for attenuating a high-frequency current from the second high-frequency power supply 15. The second high-frequency line 18 is provided with the second filter circuit 21 for attenuating a high-frequency current from the first high-frequency power supply 14. The variable capacitor 20a is provided as means for changing the circuit constant of the first filter circuit 20.

When the first filter circuit 20 optimally resonates with a high frequency of the first high-frequency power supply 14, the filter circuit may not provide a circuit constant for increasing the sputter rate on the wall surface of the processing chamber 11. In this case, the variable capacitor 20a of the first filter circuit 20 is adjusted to have a capacitor capacity so that the resonance point becomes lower than the optimum resonance point. This can decrease the sputter rate on the wall surface of the processing chamber 11, suppress damage thereto, and extend the usable life of the processing chamber 11.

The first embodiment has been explained as an example of the plasma processing apparatus capable of varying the circuit constant by providing the variable capacitor 20a in the first filter circuit 20 installed on the power supply line 16 for generating high-density plasma. It is also possible to provide a similar effect by replacing the capacitor in the first filter circuit 20 with a fixed capacitor and replacing the capacitor in the second filter circuit 21 provided on the power supply line 18 with a variable capacitor.

Figure 7:
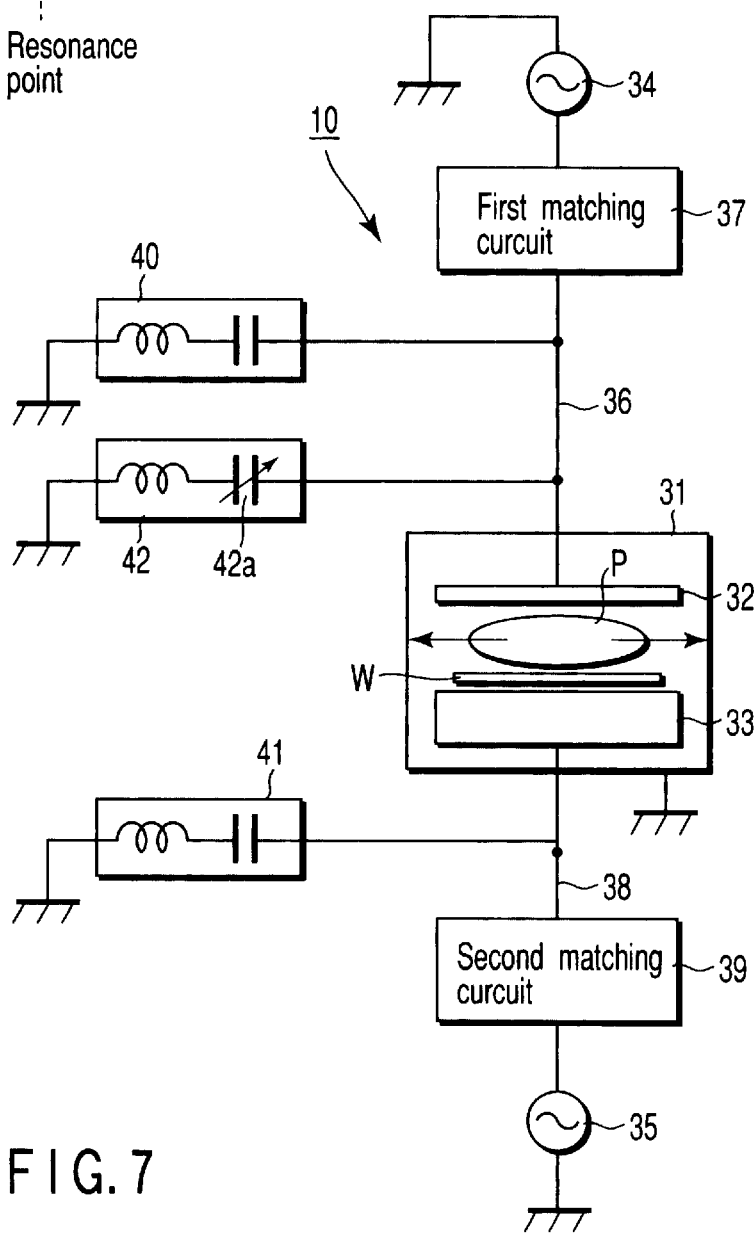
FIG. 7 is a configuration chart showing a second embodiment of the plasma processing apparatus according to the present invention.

FIG. 7 shows a schematic configuration of a plasma processing apparatus according to the second embodiment.

A plasma processing apparatus 30 includes a processing chamber 31 formed of a conductive material such as aluminum. In this processing chamber 31, an upper electrode 32 and a lower electrode 33 are arranged in parallel with a specified interval so that they face each other. The upper electrode 32 is connected to a first high-frequency power supply 34 via a first power supply line 36 and a first matching circuit 37. The lower electrode 33 is connected to a second high-frequency power supply 35 via a second matching circuit 39. This lower electrode 33 also functions as a chuck top for mounting a processing object such as a semiconductor wafer, for example.

The first high-frequency power supply 34 applies, say, 60-MHz high-frequency power to the upper electrode 32. Plasma P is generated in an atmosphere of process gas supplied between the upper electrode 32 and the lower electrode 33.

The second high-frequency power supply 35 applies 2-MHz high-frequency power to the lower electrode 33 to generate a bias potential corresponding to the plasma potential. An ion component in the plasma is introduced to the surface of a semiconductor wafer W for performing, say, reactive ion etching (RIE).

The first power supply line 36 is provided with a third filter circuit 40 for attenuating the second frequency power from the second high-frequency power supply 35. A first filter circuit 42 capable of varying the circuit constants is provided between the third filter circuit 40 on the first power supply line 36 and the processing chamber 31. The second power supply line 38 is provided with a second filter circuit 41 for attenuating the first high-frequency power. The LC series resonant circuits with fixed circuit constants, respectively.

The first filter circuit 42 includes a variable capacitor 42a. This variable capacitor 42a is used to decrease the sputter rate by slightly adjusting the circuit constants of 2.5 $\mu$H and 2,500 pF for optimum resonance down to the circuit constants of 2.5 $\mu$H and 2,000 pF for less effective resonance.

On the first power supply line 36, the third filter circuit 40 is exclusively used for attenuating high frequency from the second high-frequency power supply 35. The first filter circuit 42 is exclusively used for decreasing the sputter rate.

Accordingly, this second embodiment can provide effects similar to those for the above-mentioned first embodiment.

The second embodiment has been explained as an example of the plasma processing apparatus capable of varying the circuit constant by providing the variable capacitor 42a in the first filter circuit 42 installed on the power supply line 36 for generating high-density plasma. It is also possible to provide a similar effect by substituting a variable capacitor for the capacitor in the second filter circuit 41 installed on the power supply line 38, for generating a bias potential.

Figure 8:
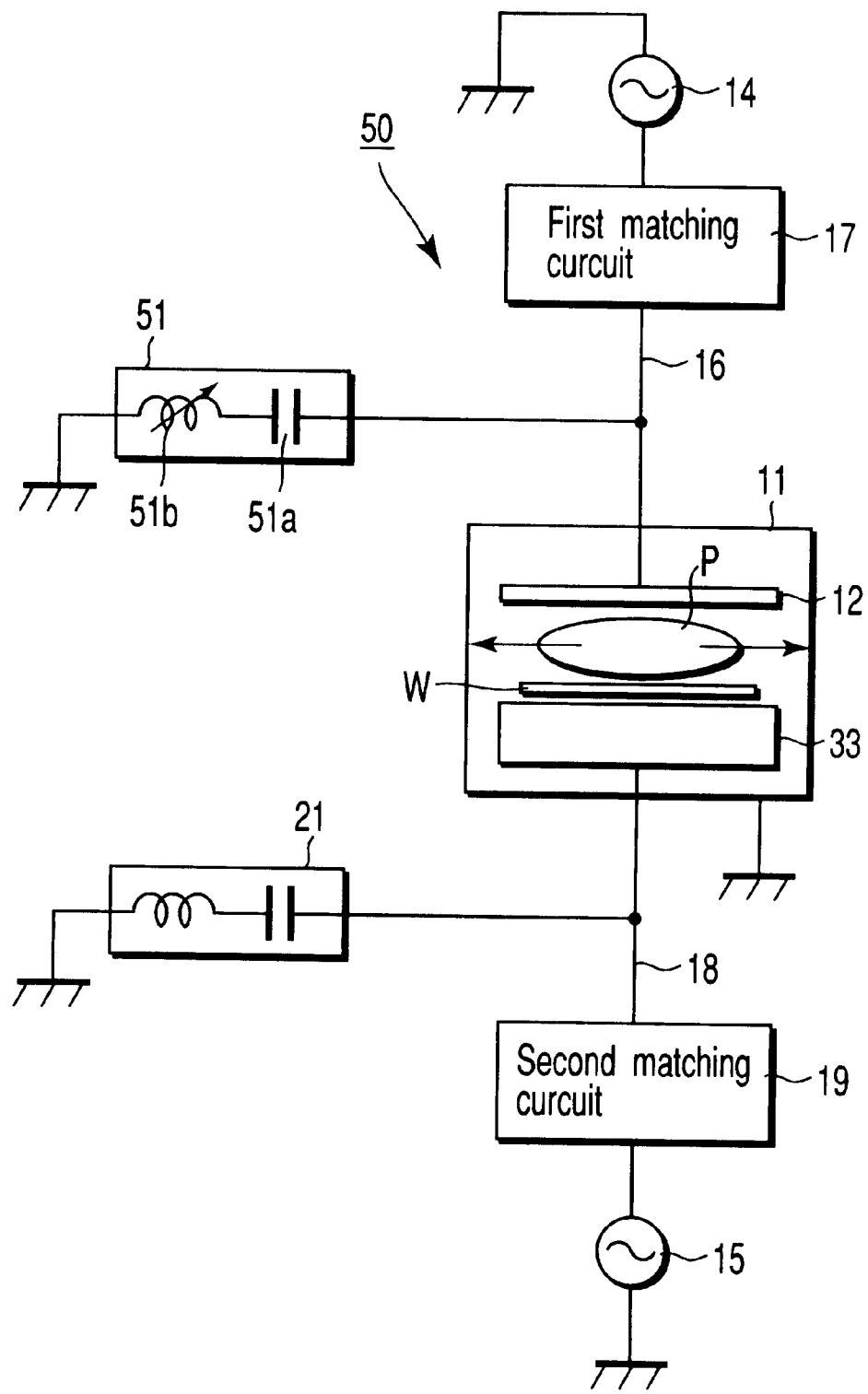
FIG. 8 is a configuration chart showing a third embodiment of the plasma processing apparatus according to the present invention.

FIG. 8 shows a schematic configuration of a plasma processing apparatus according to the third embodiment. The mutually corresponding parts in FIGS. 8 and 1 for the first embodiment are designated by the same reference numerals and a detailed description is omitted for simplicity.

This plasma processing apparatus 50 substitutes a fixed capacitor for a variable capacitor (C) in a first filter circuit 51 connected to the first power supply line 16. The fixed coil is replaced by a variable coil for configuring variable inductance.

This is because the similar effects are available by making frequency f greater than the optimum resonance point and shifting the resonance point to the negative side. Instead of the capacitor capacity, the inductance is varied so that the resonance point becomes greater. Accordingly, it is possible to increase the sputter rate of the plasma P by varying the inductance of the variable coil 51b.

Figure 9:
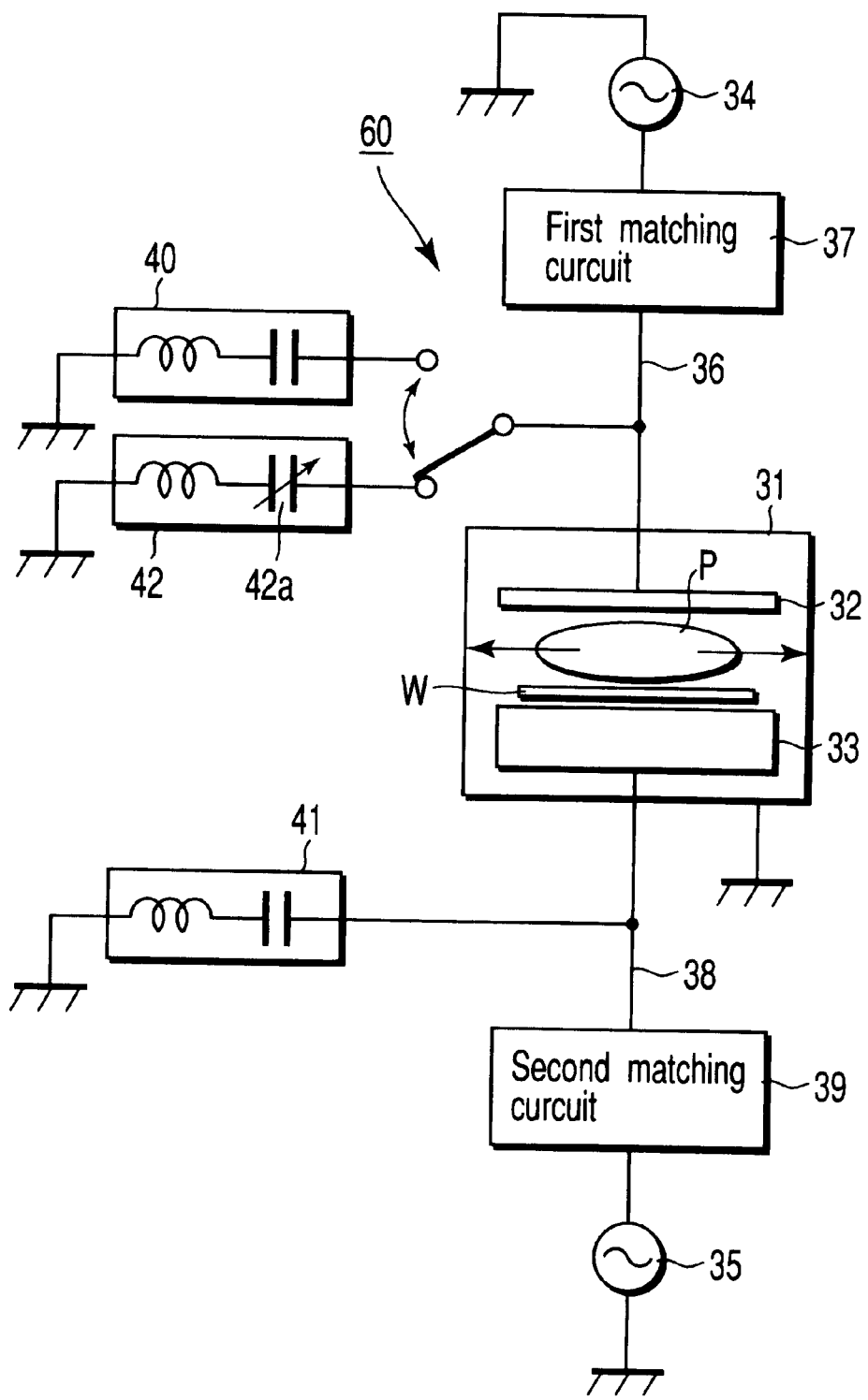
FIG. 9 is a configuration chart showing a fourth embodiment of the plasma processing apparatus according to the present invention.
Figure 10:
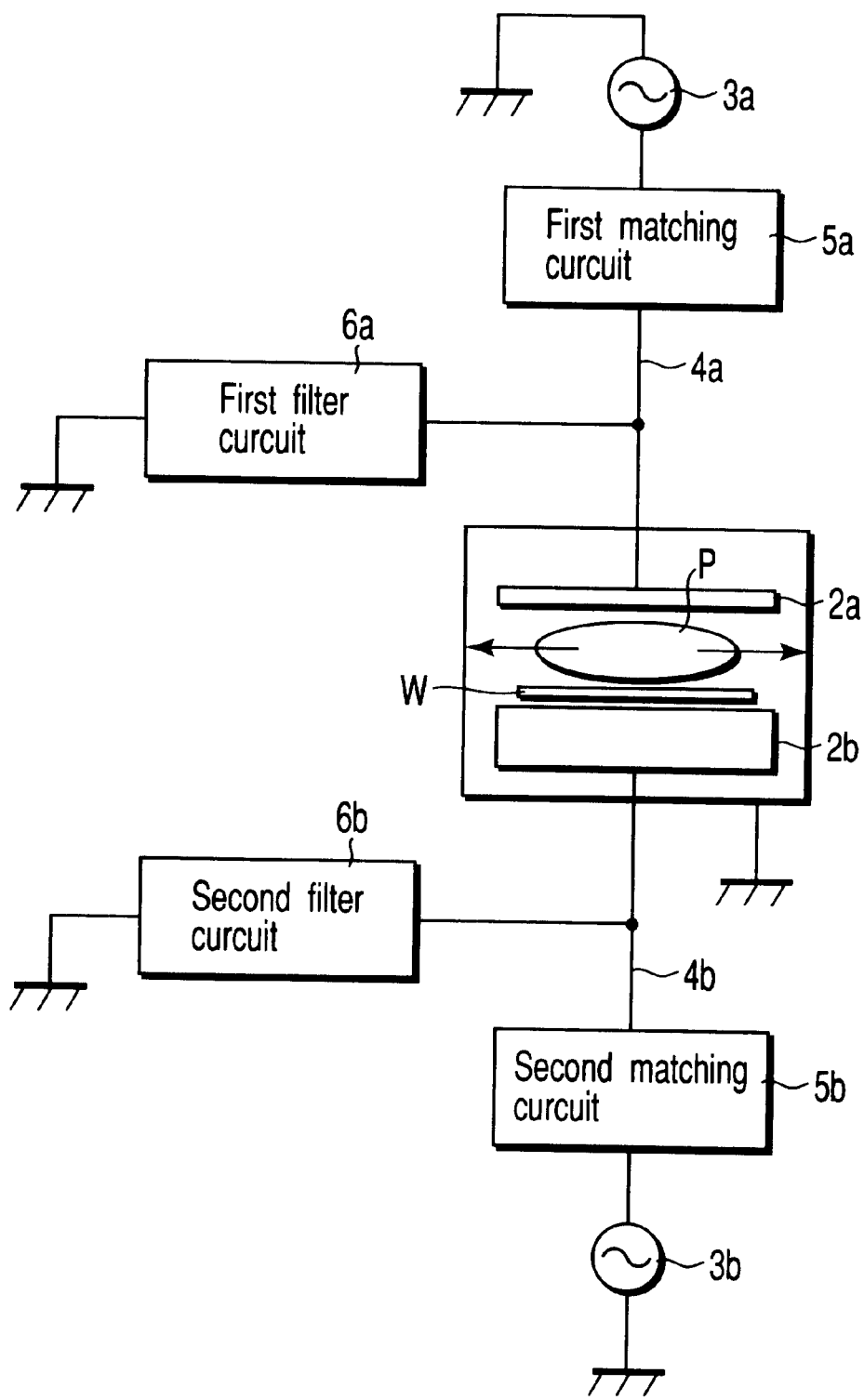
FIG. 10 is a configuration chart exemplifying a conventional plasma processing apparatus.

FIG. 9 shows a schematic configuration of a plasma processing apparatus according to the fourth embodiment. The mutually corresponding parts in FIGS. 9 and 7 for the second embodiment are designated by the same reference numerals and a detailed description is omitted for simplicity.

A plasma processing apparatus 60 according to this embodiment is configured to provide a selection switch 43 between the first filter circuit 40 and the third filter circuit 42 according to the above-mentioned second embodiment.

This configuration example makes processing chamber protection and throughput selectable so as to comply with the process conditions for various processing objects. Namely, a process may have little effect on the processing chamber in such a case that the high-frequency power supply generates little high-frequency power or the processing object is processed in a short time. In this case, the plasma processing apparatus selects the conventional third filter circuit 40 with the fixed circuit constant to give preference to the productivity for improved throughput. By contrast, a process may have a large effect on the processing chamber in such a case that the high-frequency power supply generates a large high-frequency power or the processing object is processed in a long time. In this case, the plasma processing apparatus selects the first filter circuit 42 to give preference to processing chamber protection.

Always protecting the processing chamber's inner wall degrades throughput in some degree. Since the selection switch is provided, it is possible to determine whether to prioritize protection of the processing chamber's inner wall or improvement of the throughput.

As in the third embodiment, the fourth embodiment can also provide similar effects by using the variable coil instead of the variable capacitor.

Each of the above-mentioned embodiments can decrease the sputter rate on the wall surface of the processing chamber, suppress damage thereto, and extend the usable life of the processing chamber.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus for applying specified plasma processing to a processing object, comprising:

first and second electrodes arranged in parallel in a processing chamber;

a first high-frequency power supply for applying first high-frequency power to said first electrode via a first power supply line;

a second high-frequency power supply for applying second high-frequency power to said second electrode via a second power supply line;

a first filter circuit for attenuating said second high-frequency power flowing through said first power supply line; and a second filter circuit for attenuating said first high-frequency power flowing through said second power supply line, wherein said first filter circuit includes a variable capacitor for varying a circuit constant in order to increase a resonance point from an optimum resonance point most attenuating said second high-frequency power and for decreasing a sputter rate for a wall surface of said processing chamber during plasma occurrence.

2. The first filter circuit according to claim 1, wherein a resonance point most attenuating high-frequency power depends on frequency $f[=\frac{1}{2}\pi\sqrt{(L \cdot C)}]$ according to a capacitor (capacitor capacity C) and a coil (inductance L) constituting a filter circuit.

3. The second filter circuit instead of said first filter circuit according to claim 1, wherein there is provided a variable capacitor for varying a circuit constant and decreasing a sputter rate for a wall surface of said processing chamber during plasma occurrence so that a resonance point becomes greater than an optimum resonance point most attenuating said first high-frequency power.

4. Means for varying said circuit constant according to claim 1, wherein a variable coil is provided instead of said variable capacitor to change said circuit constant by varying an inductance.

5. A plasma processing apparatus for applying specified plasma processing to a processing object, comprising:

first and second electrodes arranged in parallel in a processing chamber so that they face each other;

a first high-frequency power supply for applying first high-frequency power to said first electrode via a first power supply line;

a second high-frequency power supply for applying second high-frequency power to said second electrode via a second power supply line;

a first filter circuit for decreasing a sputter rate for a wall surface of said processing chamber during plasma occurrence by having a variable capacitor for varying a circuit constant so that a resonance point becomes greater than an optimum resonance point most attenuating said second high-frequency power flowing through the first power supply line;

a second filter circuit for attenuating said first high-frequency power flowing through said second power supply line; and a third filter circuit for attenuating a second high-frequency power flowing through said first power supply line, wherein said third filter circuit is provided adjacent to said first filter circuit.

6. The second filter circuit instead of said first filter circuit according to claim 5, wherein there is provided a variable capacitor for varying a circuit constant and decreasing a sputter rate for a wall surface of said processing chamber during plasma occurrence so that a resonance point becomes greater than an optimum resonance point most attenuating said first high-frequency power.

7. The plasma processing apparatus according to claim 5, further comprising:

a selection switch for connecting one of said first filter circuit and said third filter circuit to said first power supply line, wherein selection of said selection switch determines whether to prioritize attenuation of second high-frequency power flowing through said first power supply line or to decrease a sputter rate for a wall surface of said processing chamber during plasma occurrence.

* * * * *